(12) United States Patent
Xavier

(10) Patent No.: US 10,960,837 B2
(45) Date of Patent: Mar. 30, 2021

(54) SYSTEM AND METHOD FOR MANAGING THE BACKUP BATTERY FOR AN EMERGENCY CALL DEVICE

(71) Applicants: Continental Automotive France, Toulouse (FR); Continental Automotive GmbH, Hannover (DE)

(72) Inventor: Ludovic Marie-Joseph Xavier, Saint-Hilarion (FR)

(73) Assignees: Continental Automotive France, Toulouse (FR); Continental Automotive GmbH, Hannover (DE)

( * ) Notice: Subject to any disclaimer, the term of this patent is extended or adjusted under 35 U.S.C. 154(b) by 0 days.

(21) Appl. No.: 16/489,001

(22) PCT Filed: Jun. 28, 2018

(86) PCT No.: PCT/FR2018/051592
§ 371 (c)(1),
(2) Date: Aug. 27, 2019

(87) PCT Pub. No.: WO2019/002778
PCT Pub. Date: Jan. 3, 2019

(65) Prior Publication Data
US 2020/0010034 A1   Jan. 9, 2020

(30) Foreign Application Priority Data

Jun. 30, 2017 (FR) ........................................ 1756151

(51) Int. Cl.
*B60R 16/033* (2006.01)
*H02J 9/06* (2006.01)
(Continued)

(52) U.S. Cl.
CPC ........ *B60R 16/033* (2013.01); *G01R 31/3842* (2019.01); *G01R 31/392* (2019.01); *H02J 9/061* (2013.01); *H02M 3/158* (2013.01)

(58) Field of Classification Search
CPC .......................... B60R 16/033; G01R 31/392; G01R 31/3842; H02J 9/061; H02J 9/06; H02M 3/158
See application file for complete search history.

(56) References Cited

U.S. PATENT DOCUMENTS

| | | | |
|---|---|---|---|
| 8,812,061 B2 | 8/2014 | Springs et al. | |
| 2008/0111423 A1* | 5/2008 | Baker | H02J 7/02 307/64 |

(Continued)

OTHER PUBLICATIONS

English Translation of the Written Opinion for International Application No. PCT/FR2018/051592, dated Oct. 9, 2018, 6 pages.
(Continued)

*Primary Examiner* — Rexford N Barnie
*Assistant Examiner* — Elim Ortiz
(74) *Attorney, Agent, or Firm* — RatnerPrestia

(57) ABSTRACT

A backup power supply system that is intended to be installed in a vehicle, the system includes a backup battery, a synchronous voltage step-up circuit, a user device providing an emergency service, supplied with power under normal circumstances by the main battery of the vehicle, and under exceptional circumstances by the backup battery through the voltage step-up circuit. The voltage step-up circuit includes a coil, a first transistor and a second transistor. The system includes a backup battery discharge test circuit. The first transistor is used to draw current from the backup battery according to a predefined pattern, which makes it possible, by simultaneously measuring the voltage of the backup battery, to determine an indicator of the state of health of the backup battery.

10 Claims, 4 Drawing Sheets

(51) Int. Cl.
*G01R 31/392* (2019.01)
*G01R 31/3842* (2019.01)
*H02M 3/158* (2006.01)

(56) References Cited

U.S. PATENT DOCUMENTS

2009/0140673 A1* 6/2009 Kasai ..................... H02J 1/08
    318/139
2012/0013175 A1* 1/2012 Newman, Jr. ......... B60R 16/033
    307/9.1
2013/0322488 A1* 12/2013 Yazami ................. B60L 58/13
    374/142
2016/0329607 A1* 11/2016 Miyao .................. H01M 10/48

OTHER PUBLICATIONS

International Search Report and Written Opinion for International Application No. PCT/FR2018/051592, dated Oct. 9, 2018—8 pages.

* cited by examiner

SYSTEM AND METHOD FOR MANAGING THE BACKUP BATTERY FOR AN EMERGENCY CALL DEVICE

CROSS REFERENCE TO RELATED APPLICATIONS

This application is the U.S. National Phase Application of PCT International Application No. PCT/FR2018/051592, filed Jun. 28, 2018, which claims priority to French Patent Application No. 1756151, filed Jun. 30, 2017, the contents of such applications being incorporated by reference herein.

FIELD OF THE INVENTION

The present invention relates to systems and methods for managing the backup battery for an emergency call device.

BACKGROUND OF THE INVENTION

In practice, to make an emergency call in an exceptional situation, in particular in road traffic, a backup, electrical power supply system, intended to be installed in a vehicle, is provided, the system comprising a backup battery, a voltage step-up circuit and at least one user device providing an emergency call service, which is supplied with power under normal circumstances by the main battery of the vehicle, and under exceptional circumstances by the backup battery through the voltage step-up circuit, in the event of an accident and in the absence of power supplied by the main battery of the vehicle for example.

It should be noted that the nominal voltage of the backup battery is lower than that of the main battery of the vehicle. More specifically, the nominal voltage of the main battery of the vehicle is generally at least 12 volts. The nominal voltage of the backup battery may typically be 3 V, and more generally be between 1.5 V and 9 V. Thus, it will be necessary to make use of a voltage step-up circuit as mentioned above.

This backup battery is preferably rechargeable battery. The state of charge and the state of health of this backup battery should be monitored regularly so as to guarantee that when it is needed to call upon this backup battery, the battery is able to supply enough power to ensure that it is possible to make one (or more) emergency calls, even several years after the vehicle was first brought onto the road.

One example of such a backup battery and of its use is found in document U.S. Pat. No. 8,812,061, incorporated herein by reference.

The state of health of the backup battery is usually monitored by means of a discharge test, which is carried out periodically. The frequency of the discharge test may for example be once a month. If the discharge test shows that the backup battery has lost too much capacity, a "maintenance needed" message is displayed or transmitted to the driver (or to the owner) of the vehicle so that the backup battery can be replaced by a new one.

In the known configurations, a specific discharge test circuit, based for example on a p-type MOSFET and a "current source" circuit, is used.

SUMMARY OF THE INVENTION

However, the inventors have identified a need to improve the known configurations in order to optimize the cost of the solution.

To this end, what is proposed here is a backup power supply system that is intended to be installed in a vehicle, the system comprising:
  a backup battery;
  a synchronous voltage step-up circuit;
  at least one user device providing an emergency service, supplied with power under normal circumstances by the main battery of the vehicle, and under exceptional circumstances by the backup battery through the voltage step-up circuit.
The voltage step-up circuit further comprises;
  a coil,
  a first transistor, referred to as the foot transistor;
  a second transistor, referred to as the output transistor.
The power supply system is noteworthy in that the system comprises a backup battery discharge test circuit, wherein the first transistor is used to draw current from the backup battery according to a predefined pattern, which makes it possible, by simultaneously measuring the voltage of the backup battery, to determine an indicator of the state of health of the backup battery.

By virtue of such a system, the first transistor is used both for the voltage step-up function, with the first and second transistors being driven alternately, and for the discharge test function, with the first transistor being driven and with the second transistor remaining in the off state during the discharge test.

The voltage step-up and discharge test functions are made exclusive, which presents no problem per se given the context of use, and the first transistor is used jointly by both functions, which allows the total cost of the system to be decreased.

In various embodiments of the system according to an aspect of the invention, recourse may furthermore potentially be had to one or more of the following provisions:

According to one aspect, the system may comprise means for measuring the current flowing through the coil and through the first transistor, for applying the predefined current pattern during the discharge test. Measuring the current allows the current to be tracked and controlled according to the predefined current pattern, for driving the first transistor either in on/off mode or in linear mode.

According to one aspect, the system may comprise a coulometer circuit for measuring the actual discharge during the discharge test, the coulometer circuit being arranged across the terminals of a resistor that is connected in series with the coil. This results in a high accuracy of measurement for establishing the indicator of the state of health of the backup battery.

According to one aspect, the system may comprise a third switching means allowing the voltage step-up circuit to be connected selectively to the user device, in particular in the event of loss of power supplied by the main battery of the vehicle. The third transistor allows the backup battery subsystem to be isolated. The third transistor also allows the user systems, and in particular their memory, to stay powered, which is very useful in the modes of use referred to as "transport mode" and "longstay parking".

According to one aspect, during the discharge test, the second transistor and/or the third transistor remain in the off state. Thus, there is no external influence during the discharge test.

According to one aspect, the first transistor is an n-channel MOSFET. An n-channel MOSFET is a more robust solution than a p-channel MOSFET.

According to one aspect, the first transistor is driven in linear mode. This forms a current source like in the conventional DCR (direct current rating) method.

According to one aspect, the first transistor is driven in on/off mode. This gives a simple control diagram for the gate of the MOSFET in question.

Another subject of an aspect of the invention is a method for testing the state of health of a backup battery in a backup power supply system that is intended to be installed in a vehicle, the system comprising: a backup battery, a synchronous voltage step-up circuit, at least one user device providing an emergency service, supplied with power under normal circumstances by the main battery of the vehicle, and under exceptional circumstances by the backup battery through the voltage step-up circuit, the voltage step-up circuit comprising a coil, a first transistor, referred to as the foot transistor, and a second transistor, referred to as the output transistor, the method comprising:

for the voltage step-up function, driving the first and second transistors alternately;

for the discharge test function, driving the first transistor cyclically or driving the first transistor linearly, with the second transistor remaining in the off state during the discharge test.

According to one aspect, the method may be such that the first and second transistors are further used for the function of recharging the backup battery.

BRIEF DESCRIPTION OF THE DRAWINGS

Other aspects, aims and advantages of the invention will become apparent on reading the following description of one of its embodiments, which embodiment is given by way of nonlimiting example. Aspects of the invention will also be better understood in light of the appended drawings, in which.

DETAILED DESCRIPTION OF THE PREFERRED EMBODIMENTS

In the various figures, the same references denote identical or similar elements.

Figure 1:
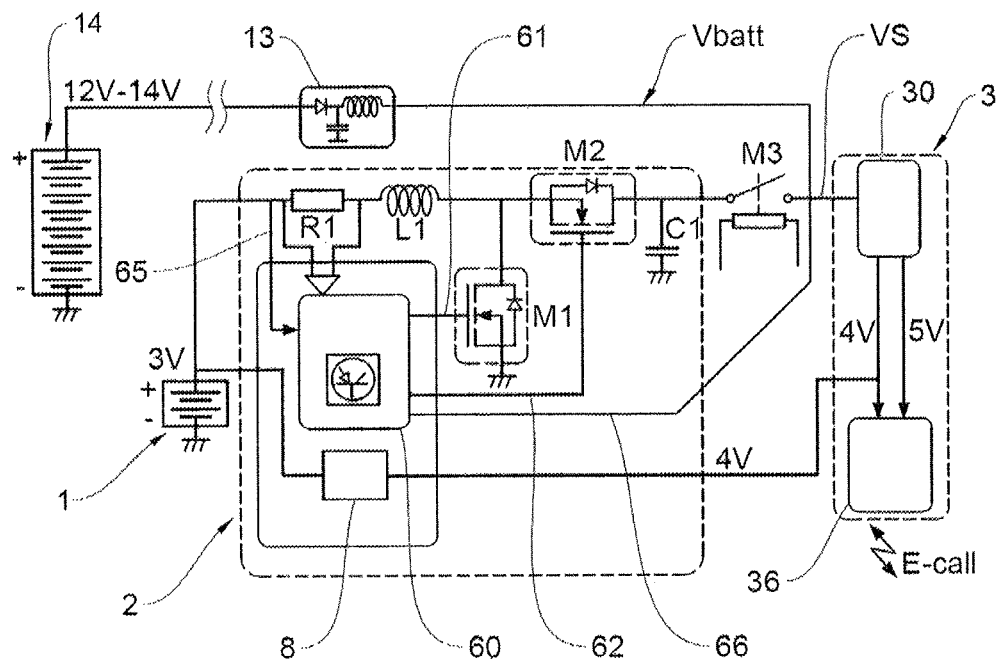
FIG. 1 shows a general diagram of a backup power supply system that is intended to be installed in a vehicle, for supporting in particular the emergency call function.

FIG. 1 schematically shows a backup electrical power supply system that is intended to be installed in a motor vehicle, in addition to a conventional electrical power supply line from the main battery 14 of the vehicle.

This redundant power supply system supports in particular the emergency call function, particularly, but not exclusively, in the context of an accident in road traffic.

More specifically, downstream of the backup power supply, a user device 3, providing an emergency call service, is provided, this user device being supplied with power under normal circumstances by the main battery 14 of the vehicle, and under exceptional circumstances by the backup battery 1 through a voltage step-up circuit 2, which will be described in detail below.

The user device 3 comprises in particular a GSM (or equivalent) interface with a SIM card for establishing voice and/or data communication with a remote assistance server.

The backup battery 1 is typically a lithium battery with a nominal voltage of 3 volts. It is preferably a rechargeable battery, which may periodically receive a charge top-up transparently when the vehicle is undergoing maintenance.

In particular, a lithium iron phosphate battery may be chosen, this battery exhibiting very little self-discharging.

The capacity of this battery may be chosen to be between 1000 mAh and 2000 mAh.

This type of backup battery 1 is consequently small and lightweight (in comparison with a 12 V backup battery), which is advantageous in the context of a motor vehicle.

The voltage step-up system 2 mentioned above comprises a coil L1, a resistor R1, a first transistor M1, referred to as the foot transistor, and a second transistor M2, referred to as the output transistor, which are controlled by a control unit 60.

It will be seen that these elements are used for two functions F1, F2 and even for an optional, third function F3.

F1: voltage step-up function.

F2: discharge test function (state-of-health (SOH) test).

F3: backup battery recharge function.

A switch M3 is provided downstream of the voltage step-up circuit 2. More specifically, this switch M3, which may also be referred to as "switching means", takes the form of a relay or of a field-effect transistor, this switch M3 being placed between the voltage step-up circuit 2 and the one or more user devices 3.

Figure 5:
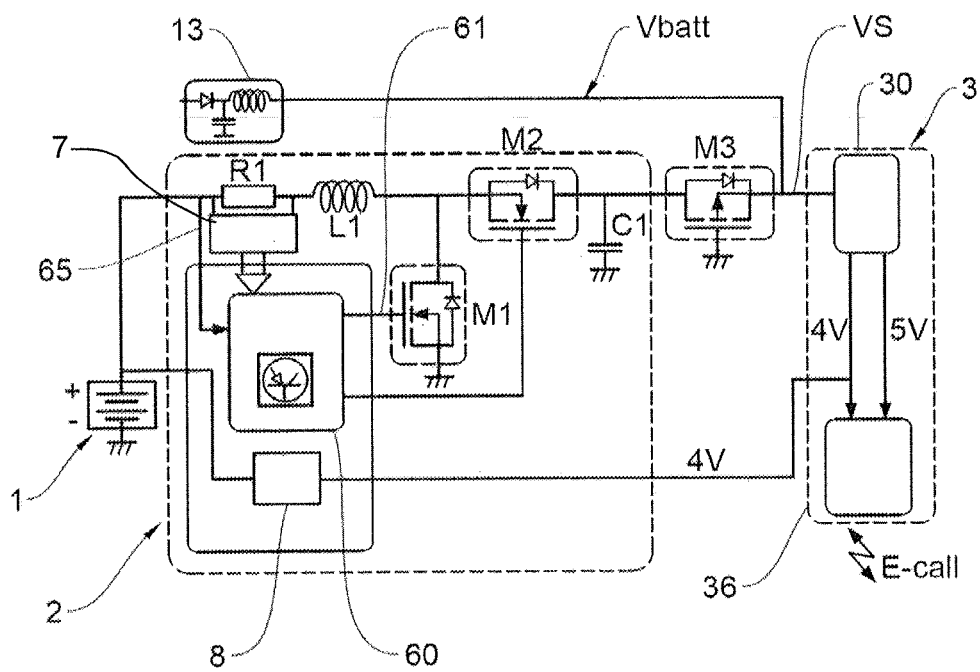
FIG. 5 shows one variant of the backup power supply system that is analogous to that of FIG. 1.
Figure 6:
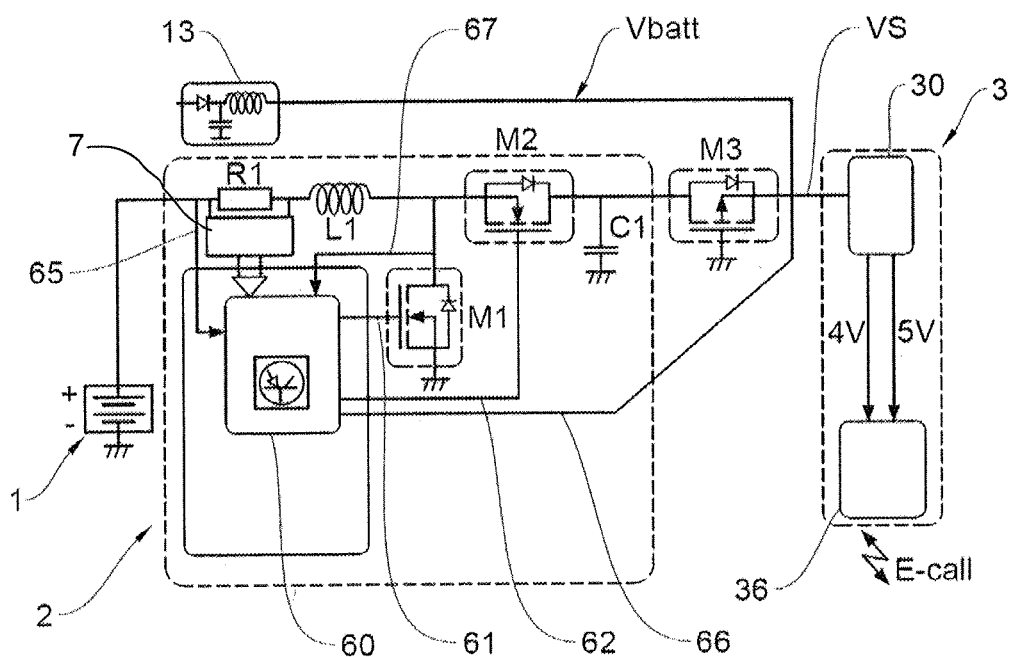
FIG. 6 shows another variant of the backup power supply system that is analogous to that of FIG. 1.

The switch denoted by M3 may be a relay, as shown in FIG. 1, or a field-effect transistor (FET) as shown in FIGS. 5 and 6.

The first transistor M1 is an n-channel transistor.

The second transistor M2 may be a p-channel transistor or an n-channel transistor.

Figure 2:
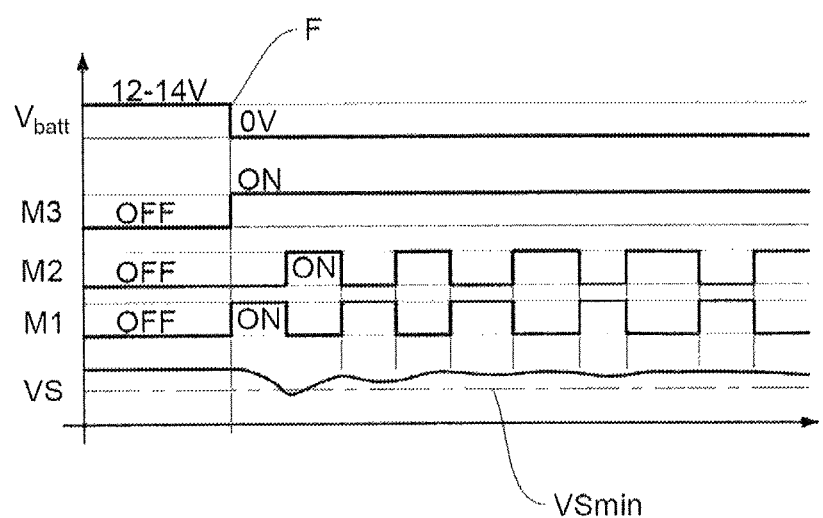
FIG. 2 shows a timing diagram illustrating the switching to the backup power supply, with the synchronous voltage step-up process.

For the voltage step-up function F1, the control unit 60 drives the first and second transistors M1, M2 alternately as illustrated in FIG. 2, via the control lines 61, 62, respectively, after the loss of power F supplied by the main battery 14.

During the operation of the voltage step-up, which is commonly also referred to as a "booster", the switch M3 is closed (i.e. on).

When the first transistor M1 is on, a current is drawn into the coil L1; next, the first transistor M1 is turned off and the second transistor M2 is opened, which results in current being output toward the capacitor C1, which is used as a reservoir and provides a filtering effect.

Each transition between the first transistor M1 and the second transistor M2 allows the charge of the capacitor C1 to be increased. The voltage step-up mechanism is known from the prior art and is therefore not described in further detail herebelow.

A reread line 66 makes it possible to control the frequency and the respective duty cycle between the first transistor M1 and the second transistor M2.

The output voltage of the step-up, denoted by VS, should be between 6 V and 14 V, more preferably between 7 V and 12 V.

The filter 13 on the "normal" power supply line comprises a diode that prevents the output voltage VS from leaking into the general network Vbatt.

It should be noted that the resistor R1 may be considered as optional in an aspect of the present invention.

The one or more user devices, denoted generically by the reference 3, may typically comprise 4 V and 5 V voltage converters, denoted by 30, the output lines of which supply power to various items of communication equipment 36, including in particular a voice and/or data radio link supporting the emergency call ("E-call") function.

Furthermore, the 4 V output voltage is used as a power source for the circuit for recharging the backup battery 1 via a charging regulator denoted by 8.

Specifically, because of natural self-discharging and the power consumed during the discharge tests, it is necessary to make provision for the backup battery 1 to be periodically recharged.

Figure 3:
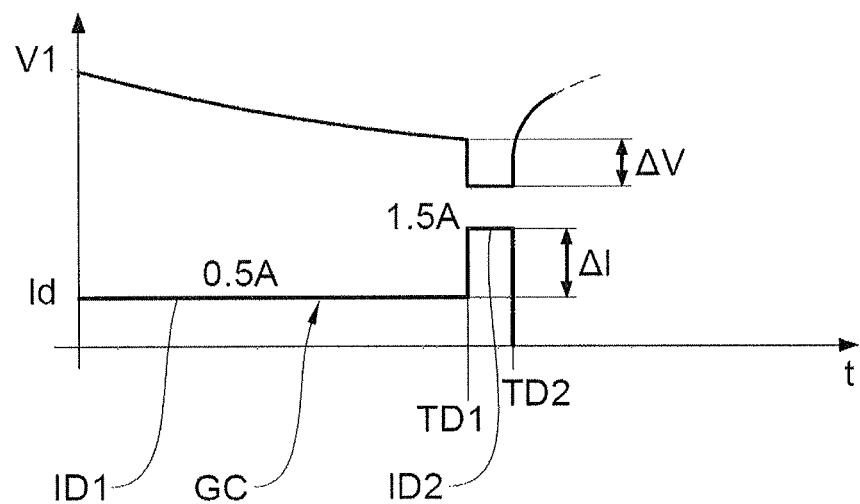
FIG. 3 shows a timing diagram illustrating the current pattern and the voltage during the discharge test.

The discharge test, in what is referred to as its DCR version, is illustrated in FIG. 3: in a first phase, a first current level ID1 is drawn for a duration TD1, followed by a second current level ID2 for a duration TD2−TD1.

It is given that:

$$\Delta V = V1 - V2,$$

and $$\Delta I = ID2 - ID1.$$

$\Delta V/\Delta I$ is characteristic of the state of health of the backup battery 1. The lower this ratio, the better the state of health of the battery.

According to one choice among a range of options:
ID1=0.5 A, and
ID2=1.5 A.

According to another choice among a range of options:

$$TD1 = 3 \text{ minutes},$$

and $$TD2 - TD1 = 4 \text{ seconds}.$$

These data constitute a predetermined discharge pattern GC; of course, other data may be chosen, in particular according to the type of backup battery.

According to this type of pattern, the first phase (from 0 to T1) is a preparation phase and the second phase (from T1 to T2) is a sustained draw phase.

The discharge test function F2 makes it possible to determine an indicator of the state of health (SOH) of the backup battery 1 according to the $\Delta V/\Delta I$ criterion mentioned above.

Figure 4:
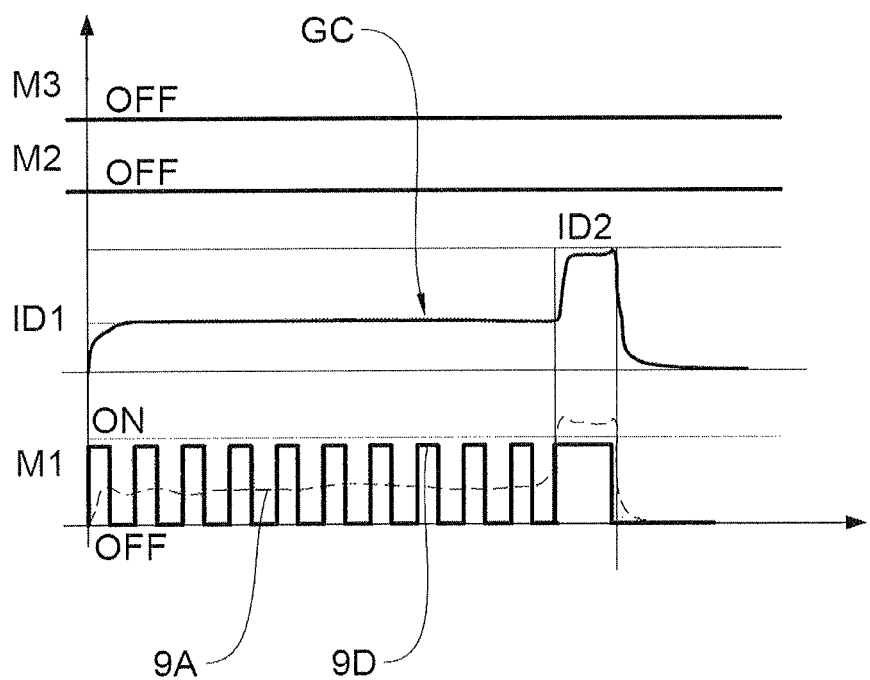
FIG. 4 shows a timing diagram illustrating two examples of driving the first transistor during the discharge test.

For the discharge test function F2, the control unit 60 drives the first transistor M1, either intermittently in on/off mode) as illustrated by the reference 9D in FIG. 4, or in continuous, or linear, mode as illustrated by reference 9A in FIG. 4.

In the case as illustrated by the pattern that is actually obtained, it is attempted to get as close as possible to the theoretical current pattern.

During the discharge test F2, it should be noted that either the second transistor M2 or the switch M3 is off, or that they are both off.

According to variants shown in FIGS. 5 and 6, the system comprises a coulometer circuit 7. The coulometer circuit 7 makes it possible to measure the actual discharge during the discharge test. This makes it possible to measure the cumulative current that flows through the resistor R1 more accurately so as to stick as close as possible to the theoretical current pattern.

In practice, the coulometer circuit is arranged across the terminals of the resistor. R1 that is placed in series with the coil L1.

Figure 7:
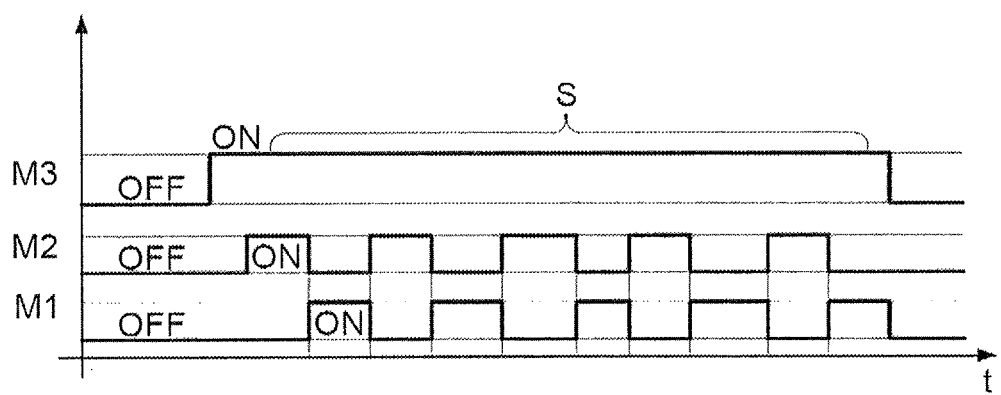
FIG. 7 shows a timing diagram illustrating one variant embodiment with an example of driving the first transistor during the recharging of the backup battery.

FIG. 6 illustrates one variant regarding the method for recharging the backup battery 1; according to this configuration, the use of a specific regulator 8 as above is avoided, and instead the first and second transistors M1, M2, controlled cyclically while the switch M3 is on, are used. This is illustrated in FIG. 7; the function for recharging the backup battery, denoted by F3, is based on the use of the first and second transistors M1, M2, with an average current that flows through the coil L1 and the resistor R1 in the opposite direction with respect to the scenario for the voltage step-up F1.

Closed-loop control via the reread circuit 65 allows the backup battery 1 to be recharged in a very narrow voltage interval, without risking damaging the backup battery 1.

Of course, it should be mentioned that this function F3 of recharging the backup battery is exclysive with respect to the voltage step-up function F1 and the discharge test function F2. However, it should also be noted that the duration of the recharging phase S is relatively short, of the order of a few minutes, and, in practice, priority is given to the function of supplying backup power via the voltage step-up F1 if needed (loss of main power supply and closure of the switch M3).

According to one variant embodiment, a reread line 67, arranged downstream of the coil L1 (cf. FIG. 6), makes it possible to obtain an image of the current that flows through the first transistor M1, thereby making it possible to refine the control of the discharge test F2.

The minimum voltage VSmin is sought for the output voltage VS of the voltage step-up.

It should be noted that VSmin=6.8 V typically, 6 V at worst.

The discharge test F2 may be carried out according to the DCR (direct current rating) method, according to the ACR (alternating current rating) method or according to a pulsed method, or according to other methods to be defined according to the specifications or recommendations from the manufacturer of the backup battery.

The invention claimed is:
1. A backup power supply system that is intended to be installed in a vehicle, the system comprising:
   a backup battery;
   a synchronous voltage step-up circuit; and
   at least one user device providing an emergency service, supplied with power under normal circumstances by a main battery of the vehicle, and under exceptional circumstances by the backup battery through the voltage step-up circuit, the voltage step-up circuit comprising:
      a coil;
      a capacitor;
      a first transistor; and
      a second transistor,
   wherein the voltage step-up circuit is configured to:
      perform a voltage step up procedure of stepping up the backup battery voltage by alternately turning the first transistor and the second transistor ON and OFF over a period of time which incrementally increases a capacitor voltage on the capacitor, and powering the at least one user device with the stepped up capacitor voltage, and perform a discharge test when the backup battery is disconnected from the user device, the discharge test including turning ON the first transistor to draw current from the backup battery according to a predefined pattern, and comparing the backup battery current to the backup battery voltage to determine an indicator of a state of health of the backup battery.

2. The system as claimed in claim 1, wherein the system comprises means for measuring the current flowing through the coil and the first transistor, for applying the predefined current pattern during the discharge test.

3. The system as claimed in claim 1, wherein the system comprises a coulometer circuit for measuring actual discharge during the discharge test, the coulometer circuit being arranged across terminals of a resistor that is connected in series with the coil.

4. The system as claimed in claim 1, wherein the system comprises a switch allowing the voltage step-up circuit to be connected selectively to the user device, in the event of loss of power supplied by the main battery of the vehicle.

5. The system as claimed in claim 4, wherein, during the discharge test, the second transistor and/or the switch remain in an off state.

6. The system as claimed in claim 1, wherein the first transistor is an n-channel MOSFET.

7. The system as claimed in claim 1, wherein the first transistor is driven in linear mode.

8. The system as claimed in claim 1, wherein the first transistor is driven in on/off mode.

9. A method for testing a state of health of a backup battery in a backup power supply system that is intended to be installed in a vehicle, the system comprising: a backup battery, a synchronous voltage step-up circuit, at least one user device providing an emergency service, supplied with power under normal circumstances by a main battery of the vehicle, and under exceptional circumstances by the backup battery through the voltage step-up circuit, the voltage step-up circuit comprising a coil, a capacitor, a first transistor, and a second transistor, the method comprising:
performing a voltage step up procedure of stepping up the backup battery voltage by alternately turning the first transistor and the second transistor ON and OFF over a period of time which incrementally increases a capacitor voltage on the capacitor, and powering the at least one user device with the stepped up capacitor voltage; and performing a discharge test when the backup battery is disconnected from the user device, the discharge test including turning ON the first transistor to draw current from the backup battery according to a predefined pattern, and comparing the backup battery current to the backup battery voltage to determine an indicator of a state of health of the backup battery.

10. The method as claimed in claim 9, wherein the first and second transistors are further used for the function of recharging the backup battery.

\* \* \* \* \*